United States Patent
Berghe

(10) Patent No.: US 9,723,763 B2
(45) Date of Patent: Aug. 1, 2017

(54) COMPUTING DEVICE, METHOD, AND COMPUTER PROGRAM FOR CONTROLLING COOLING FLUID FLOW INTO A COMPUTER HOUSING

(71) Applicant: FUJITSU LIMITED, Kawasaki-shi, Kanagawa (JP)

(72) Inventor: Sven Van Den Berghe, Marlow Bucks (GB)

(73) Assignee: FUJITSU LIMITED, Kawasaki (JP)

( * ) Notice: Subject to any disclaimer, the term of this patent is extended or adjusted under 35 U.S.C. 154(b) by 457 days.

(21) Appl. No.: 14/319,101

(22) Filed: Jun. 30, 2014

(65) Prior Publication Data
US 2015/0098180 A1    Apr. 9, 2015

(30) Foreign Application Priority Data
Oct. 3, 2013    (EP) .................................... 13187272

(51) Int. Cl.
*H05K 7/20*    (2006.01)
*G06F 1/20*    (2006.01)

(52) U.S. Cl.
CPC .......... *H05K 7/20836* (2013.01); *G06F 1/20* (2013.01); *H05K 7/20736* (2013.01); *H05K 7/20745* (2013.01)

(58) Field of Classification Search
None
See application file for complete search history.

(56) References Cited

U.S. PATENT DOCUMENTS 6,101,459 A * 8/2000 Tavallaei ................ G06F 1/206
                                                    702/130
6,826,456 B1 * 11/2004 Irving ...................... G06F 1/20
                                                    361/695
(Continued)

FOREIGN PATENT DOCUMENTS

GB    2 423 573    8/2006
JP    2003-101274    4/2003

OTHER PUBLICATIONS

Hwang et al., "Performance Measurements of a Forced Convection Air-Cooled Rack", Aug. 27, 2004, IEEE, 2004 Inter Society Conference on Thermal Phenomena, pp. 194-198.*

(Continued)

*Primary Examiner* — Jason Lin
(74) *Attorney, Agent, or Firm* — Staas & Halsey LLP

(57) ABSTRACT

A computing device having a housing; a temperature monitor to monitor a temperature within the housing; a cooling fluid drawing mechanism to draw cooling fluid into the housing; a cooling fluid drawing controller, when the computing device is installed within an enclosure as one of plural computing devices, to obtain a value representing the temperature, and if the value is within a predetermined range, to select an operating state for the mechanism from among a first state in which the mechanism draws fluid into the housing at a first rate, and a second state in which the mechanism draws cooling fluid into the housing at a second rate lower than the first rate, and to run the mechanism in the selected state; where the selection of the state is based on demand for cooling from other computing devices from among the plurality of computing devices.

8 Claims, 11 Drawing Sheets

(56) References Cited

U.S. PATENT DOCUMENTS

| | | | |
|---|---|---|---|
| 9,335,751 B1* | 5/2016 | Farshchian | G05B 15/02 |
| 2003/0053913 A1 | 3/2003 | Sekiguchi | |
| 2004/0267990 A1 | 12/2004 | Lin | |
| 2009/0222147 A1* | 9/2009 | Nakashima | G06F 1/206 |
| | | | 700/300 |
| 2010/0100254 A1* | 4/2010 | Artman | H05K 7/20836 |
| | | | 700/299 |
| 2010/0321874 A1* | 12/2010 | Bhattacharyya | H05K 7/20736 |
| | | | 361/679.5 |
| 2011/0046812 A1* | 2/2011 | Hansen | G06F 1/206 |
| | | | 700/300 |
| 2011/0160916 A1* | 6/2011 | Bahali | G05D 23/1934 |
| | | | 700/282 |
| 2011/0270464 A1 | 11/2011 | Marwah et al. | |
| 2012/0041600 A1 | 2/2012 | Micheal et al. | |
| 2013/0029578 A1 | 1/2013 | Wang | |
| 2013/0305067 A1* | 11/2013 | Lefurgy | G06F 9/4893 |
| | | | 713/320 |
| 2014/0163767 A1* | 6/2014 | Campbell | H05K 7/2079 |
| | | | 700/300 |

OTHER PUBLICATIONS

European Search Report mailed Jan. 22, 2014 in corresponding European Application No. 13187272.3-1953.
European Office Action dated Mar. 24, 2017 in European Patent Application No. 13187272.3.

* cited by examiner

| Initial State | Event | Final state |
|---|---|---|
| Cool, standard, busy | Neighbourhood quiet | Cool, standard, quiet |
| Cool, standard, busy | Temperature to warm | Warm, standard, busy |
| Cool, standard, quiet | Neighbourhood busy | Cool, standard, busy |
| Cool, standard, quiet | Temperature to warm | Warm, enhanced, quiet |
| Warm, standard, busy | Temperature to cool | Cool, standard, busy |
| Warm, standard, busy | Timer expired | Warm, enhanced, busy |
| Warm, standard, busy | Temperature to hot | Hot, enhanced, busy |
| Warm, standard, busy | Neighbourhood quiet | Warm, enhanced, quiet |
| Warm, enhanced, busy | Timer expired | Warm, standard, busy |
| Warm, enhanced, busy | Neighbourhood quiet | Warm, enhanced, quiet |
| Warm, enhanced, busy | Temperature hot | Hot, enhanced, busy |
| Warm, enhanced, busy | Temperature to cool | Cool, standard, busy |
| Warm, enhanced, quiet | Neighbourhood busy | Warm, enhanced busy |
| Warm, enhanced, quiet | Temperature to cool | Cool, standard, quiet |
| Warm, enhanced, quiet | Temperature to hot | Hot, enhanced, quiet |
| Hot, enhanced, busy | Neighbourhood quiet | Hot, enhanced, quiet |
| Hot, enhanced, busy | Temperature to warm | Warm, enhanced, busy |
| Hot, enhanced, quiet | Neighbourhood busy | Hot, enhanced, busy |
| Hot, enhanced, quiet | Temperature to warm | Warm, enhanced, quiet |

FIGURE 9

COMPUTING DEVICE, METHOD, AND COMPUTER PROGRAM FOR CONTROLLING COOLING FLUID FLOW INTO A COMPUTER HOUSING

CROSS REFERENCE TO RELATED APPLICATIONS

This claims the benefit of European Application No. 13187272.3, filed Oct. 3, 2013, the disclosure of which is incorporated herein by reference.

BACKGROUND OF THE INVENTION

The present invention relates to a method, computing device and computer program for controlling the rate at which cooling fluid is drawn into a computer housing. In particular, embodiments have application in computing devices housed in enclosures such as data centre halls.

The equipment in data centres, such as computer servers and storage devices, generates a lot of heat while it operates. In most data centres this heat is removed by moving air through the data centre, see FIG. 1, which provides an overview of airflow in a data centre. Cool air is introduced into the data centre hall by cooling equipment 1 and it is forced to flow towards the IT equipment by a set of fans 2 external to the IT equipment. The cool air is then introduced into one end of the IT equipment 3 and drawn through the IT equipment 3 by smaller fans 4 inside the equipment. The air passes over the hot components inside the IT equipment 3 and hot air leaves the IT equipment 3. The hot air circulates back to the central cooling equipment 1 so removing the heat from the IT equipment 3. This process must be carefully managed to ensure that the right amount of cold air arrives at the inlets of all the IT equipment 3: too little air and the equipment overheats, too much air results in wasted energy cooling and moving the air. Of course, alternative systems exist in which the cooling fluid is liquid which is piped through IT equipment and flow is controlled by a series of valves. Similar considerations apply.

Data centre halls may be large, enclosed spaces, and so the overall air-flow pattern is the result of the interactions of all the air moving equipment, the fans internal to the IT equipment 4 and the external cooling fans 2. It is typical in data centre management to allow the IT equipment 3 to operate their fans 4 with a large degree of autonomy. IT equipment fans 4 will respond to changes in the conditions in their local piece of equipment only, increasing airflow rate if local heating is detected and decreasing airflow rate once the optimal temperature is reached. The central cooling fans 2 will operate according to other policies, sometimes they have static speed, in other installations their speed will change according to the sensed temperature of the return (hot) air.

Cooling fluid is a limited resource shared among computing devices. There is a limited supply for a collection of servers, and those furthest away from the source of cooling rely on those nearer to allow some cooling fluid to pass. On the other hand, it is inefficient to oversupply cooling (and in that way guarantee that all the servers can have access to cooling) as in most cases the excess will pass through the data centre unused.

Effective airflow patterns can be established, usually by the manual intervention of data centre managers. The managers may control the gross characteristics of the flow of air, for example by opening or closing vents and perforations, by creating barriers and by setting the speed of the fans on the central cooling equipment. The fans in the IT equipment are not usually under the control of the managers. The airflow pattern in the data centre is carefully monitored and adjustments made until a good airflow regime is created. The established airflow pattern remains static if the heat generated by the IT equipment is constant, for example, in data centres in which the amount of work done by servers changes slowly and the amount of heat generated is insensitive to load.

FIG. 2 illustrates in very simple terms an effective airflow pattern. The arrows represent the flow of cold air. The IT equipment 3 is, for example, a rack of servers. The cold air flows into the aisle at the side of the inlets to the IT equipment 3. The equal number of arrows pointing into each server in the rack indicates an equal share of the cooling fluid from central cooling being drawn into each server. Based on the assumption of an even workload across the servers, this is a desirable airflow pattern.

There is a trend among data centres to become more dynamic in terms of load distribution. The loads on the IT equipment are becoming more dynamic and the IT equipment is now designed to use energy efficiently, which means that the amount of heat generated is much more variable with load.

As a result the airflow patterns are much more dynamic and the manual control policies described above become much less effective. FIG. 3 illustrates how a load imbalance causes an imbalance in supply of cooling fluid to IT equipment 3. Servers with extra load will heat up and draw in more air (represented by more arrows pointing into the server in the middle of the rack in FIG. 3), potentially starving neighbouring servers of cooling air (represented by fewer arrows pointing into the servers at the top of the rack in FIG. 3). This results in reduced cooling and in increased energy use as the fans speeds increase. The central cooling equipment must perform more work to ensure that a minimum level of cooling is supplied to all equipment at the cost of overcooling the best-cooled equipment. The IT equipment fans will also increase their energy usage as the poorly cooled equipment works harder to create a sufficiently large airflow.

Existing systems aim to solve such problems by providing a centralised control mechanism that optimizes the cooling of the complete system, removing the independence of the IT equipment cooling from the actions of the centralized cooling equipment. Such a control system may comprise sensors distributed throughout the data centre to measure the values of quantities that affect performance or reliability (such as temperatures and pressures). These values are reported to a centralized system through some communications network, usually dedicated to the control system. The central system processes the reported values and decides on actions to achieve the required airflow characteristics and sends commands to set the equipment to the required values.

Many data centers are collections of heterogeneous equipment, which is of various ages and comes from a variety of suppliers. Such equipment may not be configurable to integrate with a central control system as it may not support the chosen protocols or communications system.

Each new piece of equipment installed in the data centre must be integrated into the control system; and permitted onto the communications system. For example, capabilities may need to be entered into a database, and possibly also its actual location measured and recorded. Any equipment moves may also need to be carefully recorded.

The control system itself may be complex, requiring the execution of computationally expensive simulations and algorithms: needing to manage and predict the interactions between large numbers of very different equipment.

SUMMARY OF THE INVENTION

Embodiments include a computing device comprising: a housing; a temperature monitor configured to monitor a temperature within the housing; a cooling fluid drawing mechanism configured to draw cooling fluid into the housing; a cooling fluid drawing controller configured, when the computing device is installed within an enclosure as one of a plurality of computing devices, to obtain a value representing the monitored temperature, and if the value is within a predetermined range of values, to select an operating state for the cooling fluid drawing mechanism from among a first operating state in which the cooling fluid drawing mechanism is operable to draw cooling fluid into the housing at a first rate, and a second operating state in which the cooling fluid drawing mechanism is operable to draw cooling fluid into the housing at a second rate lower than the first rate, and to run the cooling fluid drawing mechanism in the selected operating state; wherein the selection of the operating state is made in dependence upon an indication of demand for cooling fluid from a group of one or more other computing devices from among the plurality of computing devices.

Under-cooling or over-cooling of computing devices can occur when computing devices are configured to behave greedily with regard to cooling resources. Cooling fluid does not necessarily get to where it is needed, and may disproportionately be drawn to locations where only a small amount is required. Embodiments of the present invention provide computing devices which are configured to behave cooperatively when drawing cooling fluid, basing a decision of how much cooling fluid to draw on the amount being demanded by fellow computing devices Embodiments address problems associated with centralised cooling control mechanisms by providing the ability for computing devices to collaboratively manage their own cooling requirements from a local perspective by being configured to behave unselfishly when their own status (temperature) permits. This removes the need for a centralised control system that tries to integrate diverse systems, removing the additional management burden, and provides a computing device that can cool itself effectively in a mixed environment without placing undue burden on fellow computing devices. Furthermore, the reactive nature of the cooling mechanism realised by devices embodying the present invention is robust to failure of particular devices.

Invention embodiments provide a mechanism to control of the speed of the fans or other cooling fluid drawing mechanisms internal to a computing device such as a server when the computing devices are arranged in large collections (e.g. in data centre halls). Advantageously, embodiments reduce competition among computing devices for limited cooling fluid. Consequently, computing devices cooperate to ensure a good supply of cooling fluid to computing devices where it is required, and the need for complex centralised monitoring and control is obviated. The central cooling system can operate at a reduced capacity without the need for complex and time-consuming control systems, thus saving energy and administrative burden.

Optionally, the indication of demand for cooling fluid from a group of one or more other computing devices from among the plurality of computing devices may be an indication of the rate at which the group of one or more other computing devices from among the plurality of computing devices are drawing cooling fluid. The indication may be an indication of the level of demand for cooling fluid from a group of one or more other computing devices from among the plurality of computing devices. For example, the group of one or more other computing devices is composed of computing devices housed on a rack which also houses the computing device. As a further example, the group of one or more other computing devices may be composed of computing devices within a predetermined maximum physical proximity to the computing device.

It may be that the cooling fluid drawing mechanism is configured to draw cooling fluid into the housing from a cooling fluid supply region, and the selection of an operating state is made in dependence upon an indication of demand for cooling fluid from the same cooling fluid supply region from the group of one or more other computing devices. The cooling fluid supply region may be a particular volume or region within the enclosure, such as an aisle or sector of the enclosure. The cooling fluid supply region may be a region supplied with cooling fluid by a single cooling fluid supply device, such as a CRAG.

Optionally, the computing device and the group of one or more other computing devices are each configured to draw cooling fluid supplied by the same cooling fluid supply device, the supply being finite, and possibly the rate of supply being lower than the combined maximum cooling fluid draw rates of the computing device and the group of one or more other computing devices.

In a particular implementation, the first and second operating states may be the only two operating states in which the cooling fluid drawing mechanism can be run. Alternatively, it may be that there are more than two operating states, and the first and second operating states are two of a plurality, or continuous range, of operating states. For example, it may be that the cooling fluid drawing controller is configured to selectively control the power or voltage supplied to the cooling fluid drawing mechanism. The first and second operating states are distinguishable in that, based on an assumption of equivalent environmental conditions, the cooling fluid drawing mechanism is configured to draw cooling fluid into the housing at a higher rate when being run in the first operating state than when being run in the second operating state. The cooling fluid drawing controller may be configured, when the computing device is installed within an enclosure as one of a plurality of computing devices, to obtain a value representing the monitored temperature, and if the value is within a predetermined range of values, to select an operating state for the cooling fluid drawing mechanism from among a plurality of operating states including a first operating state and a second operating state, wherein the rate at which the cooling fluid drawing mechanism is operable to draw cooling fluid into the housing is higher when being run in the first operating state than when being run in the second operating state (assuming equivalent environmental conditions).

The computing device may be a server or storage unit or network device. The computing device may comprise a processor, and storage, and memory, and be configured to handle computational load as part of a system of interconnected computing devices sharing a collective computational load. The computing device may be configured to handle/process an assigned share of a total load being handled/processed collectively by the plurality of computing devices in the enclosure, the share being assigned by a centralised load assignment controller.

Any one or combination of the indication receiver, cooling fluid drawing mechanism, temperature monitor, and cooling fluid drawing controller may be functions of an operating system, the operating system comprising instructions stored on a storage unit of the computing device and executed by a processor of the computing device. Furthermore, any one or combination of the indication receiver, cooling fluid drawing mechanism, temperature monitor, and cooling fluid drawing controller may be dedicated hardware devices, featuring sensors and/or microprocessors or other logic functionality.

The cooling fluid may be in the form of a gas or a liquid. The cooling fluid may be air. Alternatively, the cooling fluid may be a refrigerant pumped in pipes through the computing devices and around the enclosure, in such embodiments the cooling fluid drawing mechanism is a valve and/or a pump.

The demand for cooling fluid from a group of, for example, neighbouring computing devices in the enclosure may be detectable from an environmental variable. Optionally, the indication may be based on observation of an environmental variable in the vicinity of the computing device within the enclosure.

For example the indication may represent a noise level in the vicinity of the computing device, or the indication may represent exhaust air temperature from one or more other computing devices.

The indication may also be generated by combining one or more of the above properties. Some weighting may be applied to the properties in generating the indication. The indication may be generated directly by a monitoring device, which may comprise a sensor in combination with some control function provided either by software running on generalised hardware such as a computer, or by a dedicated controller. Such a monitoring device may be provided as part of the computing device or may be separate. The monitoring device is external to the computing device and/or may be configured to provide an indication to more than one computing device among the plurality of computing devices.

The computing device may further comprise an indication receiver configured to receive the indication from a monitoring device. The indication receiver may be provided as part of the cooling fluid drawing controller or may be a separate entity.

The indication itself may take the form of a signal taking a binary value indicating that demand for cooling fluid of the group of one or more other computing devices from among the plurality of computing devices is either high or low. A monitoring device for generating the indication based on one or more environmental variables or operating properties of the computing devices may be preconfigured with what monitored properties generate high and low indications, or it may be configurable according to the enclosure in which it is implemented.

The indication is may be determined/generated based on data reporting operating properties of the group of one or more other computing devices. For example, the indication may represent a measurement of the power being drawn by one or more other computing devices.

Alternatively, the indication may be generated based on data received from the group of one or more other computing devices reporting the operating states of their respective cooling fluid drawing mechanisms.

Embodiments include a system comprising a computing device embodying the invention and a monitoring device or monitoring apparatus configured to monitor a property correlated to the demand for cooling fluid from the group of one or more other computing devices from among the plurality of computing devices, to generate an indication representing the property, and to transmit the indication to the cooling fluid drawing controller of the computing device. A system may further comprise one or more additional computing devices embodying the invention, each of which is configured to receive the indication from the monitoring apparatus.

To some extent, the nature of the indication and the manner in which it is determined, for example, which conditions or properties are monitored and the monitored values used to generate the indication, will depend upon the form of the cooling fluid drawing mechanism in both the computing device itself and in the group of other computing devices, and in the plurality of computing devices as a whole.

In one implementation, the cooling fluid drawing mechanism of the computing device may be one fan. Furthermore, the cooling fluid drawing mechanisms of the group of other computing device may be one or more fans per computing device respectively.

A fan is configured to draw cooling fluid into the housing of a computing device. In particular, the fan may be configured to draw cooling fluid into a particular region of the computing device. It may be that the significant heat generating components, such as the CPU, are positioned in the region into which the fan is configured to draw cooling fluid. Furthermore, it may be that the temperature monitor of the computing device is configured to monitor a temperature at particular position within the housing, and the cooling fluid drawing mechanism is one fan configured to draw cooling fluid into a region of the housing surrounding the particular position.

In addition, the computing device may further comprise one or more additional temperature monitor each configured to monitor a temperature at a respective position within the housing, and the cooling fluid drawing controller is configured, for each of the one or more additional temperature monitors, to perform the process of obtaining, selecting, and running for a cooling fluid drawing mechanism configured to draw cooling fluid into a region of the housing surrounding or including the respective position. For example, the cooling fluid drawing mechanism may be a plurality of fans, and there may be a temperature monitor positioned in the region cooled (or primarily cooled) by each fan.

The or each temperature monitor may comprise one or more temperature sensors, and the value representing the temperature in the housing is based on a temperature sensed by the one temperature sensor or an aggregation of the temperatures sensed by the more than one temperature sensors.

As a particular implementation example, the cooling fluid drawing mechanism may be a plurality of fans spaced apart from one another. Optionally, each of the plurality of fans may be spaced apart from one another within the housing and positioned adjacent to a separate inlet from the other fans. The effect of the above arrangement may be that each of the plurality of fans are configured to draw cooling fluid into a different region of the housing from one another. Of course, airflow patterns within the housing of the computing device may be such that air drawn into the housing by different fans will not remain spatially separate for the duration of its time within the housing. However, the region of the housing into which the first is first drawn by the different fans may be spatially distinct.

In terms of the operating states of the cooling fluid drawing mechanism or mechanisms, in embodiments in which the cooling fluid drawing mechanism is one fan, in the first operating state the speed of the one fan is higher than in the second operating state. In embodiments in which the cooling mechanism is a plurality of fans, in the first operating state the aggregate speed of the plurality of fans is higher than in the second operating state.

An effect of the second operating state is to reduce demand on cooling fluid so that it may be used by other computing devices in the enclosure. However, the measurement of a temperature within the predetermined temperature range by the temperature monitor is an indication that there are one or more components within the housing of the computing device which would benefit from cooling (although immediate cooling is not required: a monitored temperature above the predetermined temperature range is an indication that there are one or more components within the housing which would benefit from immediate cooling). Therefore, it may be that in embodiments in which the cooling fluid drawing mechanism is a plurality of fans, a particular region or component within the housing can be cooled without increasing the overall demand for cooling fluid by the cooling fluid drawing mechanism. For example, while running the cooling fluid drawing mechanism in the second operating state, the cooling fluid drawing controller may be configured to increase the speed of one or more of the plurality of fans and to decrease the speed of one or more other of the plurality of fans, without altering the aggregate speed of the plurality of fans.

Furthermore, the cooling fluid drawing controller may be configured to send a request to one or more hardware components (such as a CPU) within the computing device (via an operating system or otherwise) to reduce power consumption if the monitored temperature is within the predetermined range of values and the indication is that demand for cooling fluid among the group of other computing devices is high.

Timers may be used as an additional means for controlling the behaviour of the cooling fluid drawing mechanism. For example, if the cooling fluid draw controller selects the second operating state, the cooling fluid draw controller is configured to determine a length of time for which to run the cooling fluid drawing mechanism in the second operating state, and, following expiry of the determined length of time, to obtain a value representing the monitored temperature, and, if the value is within the predetermined range of values, to run the cooling fluid drawing mechanism in the first operating state.

The length of time may be fixed, so that determining the length of time is imply applying the fixed length. Alternatively, the length of time may be substantially fixed but include a random element (such as being anywhere between 80 and 100% of a predetermined maximum value) in order to prevent multiple computing devices synchronously changing requirements. Advantageously, delaying the setting of the first operating state enables other computing devices in the enclosure to benefit from the additional cooling fluid that is made available in the length of time by virtue of the cooling fluid drawing mechanism of the computing device running in the second operating state. However, since the measurement of a monitored temperature value in the predetermined range of temperatures is an indication that some cooling of components in the housing would be beneficial, after the length of time has expired the cooling fluid drawing controller sets the cooling fluid drawing mechanism into the first operating state. Damage to components associated with running at a high temperature, or higher than optimum temperature, is often made worse by running the components at the high or higher temperature for prolonged period. The delayed imposition of the first operating state ensures that cooling fluid sufficient to cool the components is delivered to the components after a time.

Furthermore, it may be that in the interim period (during the length of time) cooling fluid was effectively diverted to computing devices in greater need of cooling.

Embodiments are reactive to changes in the cooling environment. For example, if the cooling fluid drawing controller is running the cooling fluid drawing mechanism in the second operating state, the cooling fluid drawing controller is configured to monitor the indication, and to change the operating state of the cooling fluid drawing mechanism from the second operating state to the first operating state in response to the indication representing a decrease in the demand for cooling fluid from the group of one or more other computing devices. Furthermore, if the cooling fluid drawing controller is running the cooling fluid drawing mechanism in the first operating state, the cooling fluid drawing controller is configured to monitor the indication, and to change the operating state of the cooling fluid drawing mechanism from the first operating state to the second operating state in response to the indication representing an increase in the demand for cooling fluid from the group of one or more other computing devices.

For example, the indication may be either high or low, so that an increase is a change from low to high, and a decrease is a change from high to low. Advantageously, embodiments in which the operating state is modified in response to changes in demand from the group of other computing devices provide the computing device with additional cooling in scenarios where it may previously have been deemed selfish to draw more cooling fluid, and prevent the computing device from drawing cooling fluid at a high rate in an environment where demand for cooling fluid is generally high.

As an additional or alternative means for responding to both local (in the housing) and environmental (external to the housing) conditions, the cooling fluid drawing controller may be configured to periodically obtain a value representing the monitored temperature, and if the obtained value is below the predetermined range of values, the cooling fluid drawing controller is configured to run the cooling fluid drawing mechanism in an operating state in which the cooling fluid drawing mechanism is operable to draw cooling fluid into the housing at a rate equal to or less than the second rate.

For example, the rate equal to or less than the second rate may be zero if the cooling fluid drawing mechanism is switched off or run in a standby mode. The predetermined range of temperature values may be set such that its lower limit is equal to or approximately equal to (for example, within 5° C.) a manufacturer-specified optimum operating temperature (or the higher end of an optimum range) for the computing device. Thus, at temperatures below the range the computing device is either at or approximately at an optimum operating temperature, and no cooling is required.

Additionally or alternatively, the cooling fluid drawing controller may be configured to periodically obtain a value representing the monitored temperature, and if the obtained value is above the predetermined range of values, the cooling fluid drawing controller is configured to run the cooling fluid drawing mechanism in an operating state in which the cooling fluid drawing mechanism is operable to draw cooling fluid into the housing at a rate equal to or higher than the first rate.

The upper limit of the predetermined range of temperature values may be set at a level above which a manufacturer or data centre manager would not wish to operate computing devices, that is, a maximum tolerable operating temperature. Advantageously, embodiments of the present invention provide a mechanism to draw cooling fluid into the housing at a higher rate without regard to other computing devices if an upper limit of a range of temperatures is exceeded.

Embodiments of another aspect of the invention include a method of controlling a cooling fluid drawing mechanism configured to draw cooling fluid into a housing of a computing device installed within an enclosure as one of a plurality of computing devices, the method comprising: obtaining a value representing a temperature within the housing from a temperature monitor, and if the value is within a predetermined range of values, selecting an operating state for the cooling fluid drawing mechanism from among a first operating state in which the cooling fluid drawing mechanism is operable to draw cooling fluid into the housing at a first rate, and a second operating state in which the cooling fluid drawing mechanism is operable to draw cooling fluid into the housing at a second rate lower than the first rate; and running the cooling fluid drawing mechanism in the selected operating state; wherein the selection of the operating state is made in dependence upon an indication of demand for cooling fluid from a group of one or more other computing devices from among the plurality of computing devices.

Advantageously, methods embodying the invention provide a way of efficiently cooling data centre enclosures without centralised control, instead using self-managed control. More efficient allocation of cooling resource to servers is made possible without installing new equipment in the data centre as the capability is within the server. Not all of the servers in an enclosure require the functionality of invention embodiments to realise an improvement in the data centre, some effect will be gained if only one or some of the servers have the functionality, and so the system as a whole is robust under failure of components.

Embodiments of another aspect of the invention include a computer program which, when executed by a computing device, causes the computing device to perform a method embodying the invention.

Embodiments provide apparatus, methods, or programs enabling computing devices in an enclosure to monitor conditions correlated to cooling fluid demand in a group of computing devices, such as their local neighbourhood, using one or more of a variety of techniques such as noise levels, exhaust air temperature values or power draws. If the local cooling demands are high a computing device will reduce its cooling demands, but if local cooling demands are low a computing device will take any extra cooling that it needs. In this way computing devices collaboratively control their local cooling environment to ensure good supply to all the computing devices, so allowing more efficient collective cooling without the need for a centralised cooling control.

BRIEF DESCRIPTION OF THE DRAWINGS

Preferred features of the present invention will now be described, purely by way of example, with reference to the accompanying drawings, in which:—

FIG. 9 is a table of state transitions in invention embodiments.

DETAILED DESCRIPTION OF THE PREFERRED EMBODIMENTS

Figure 1:
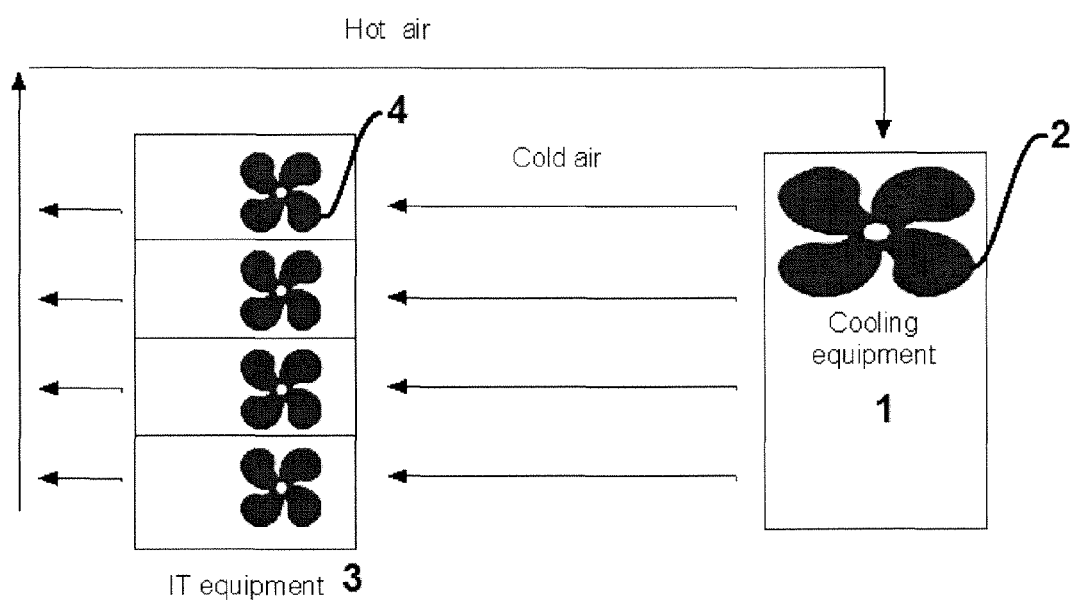
FIG. 1 provides an overview of airflow in a data centre.
Figure 2:
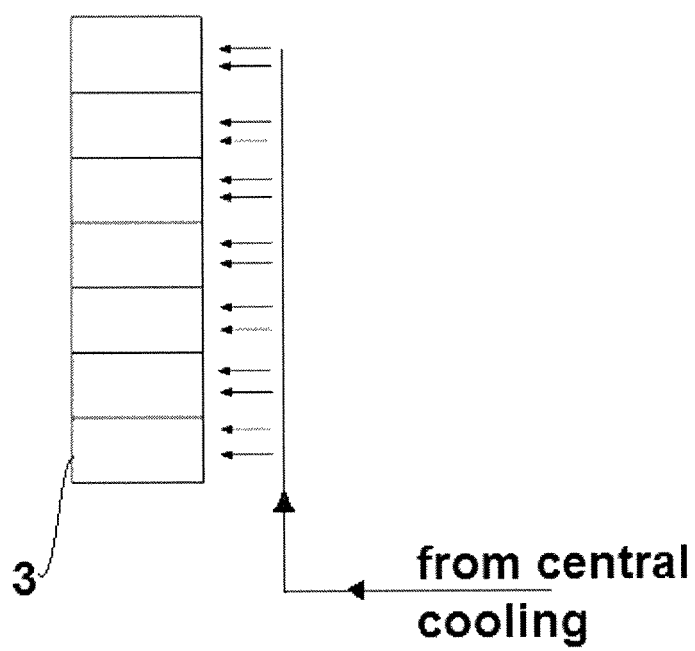
FIG. 2 illustrates an effective airflow pattern.
Figure 3:
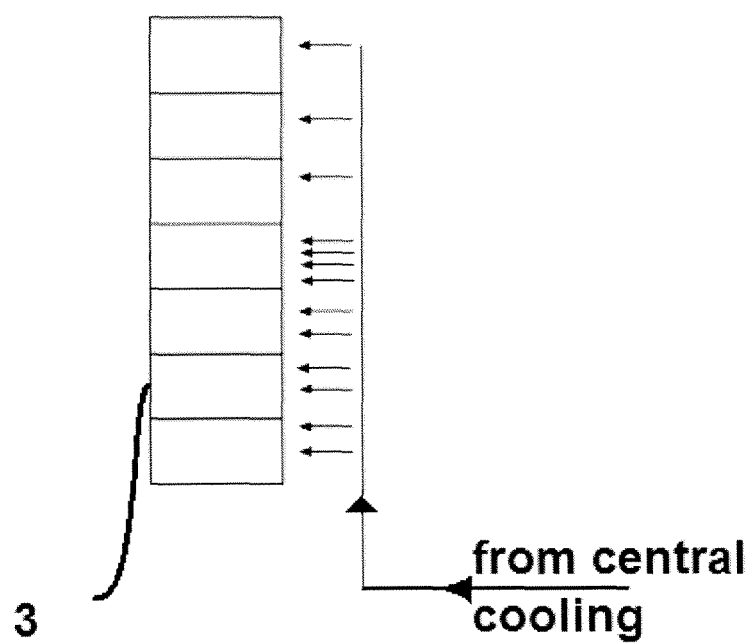
FIG. 3 illustrates a problematic airflow pattern.
Figure 4:
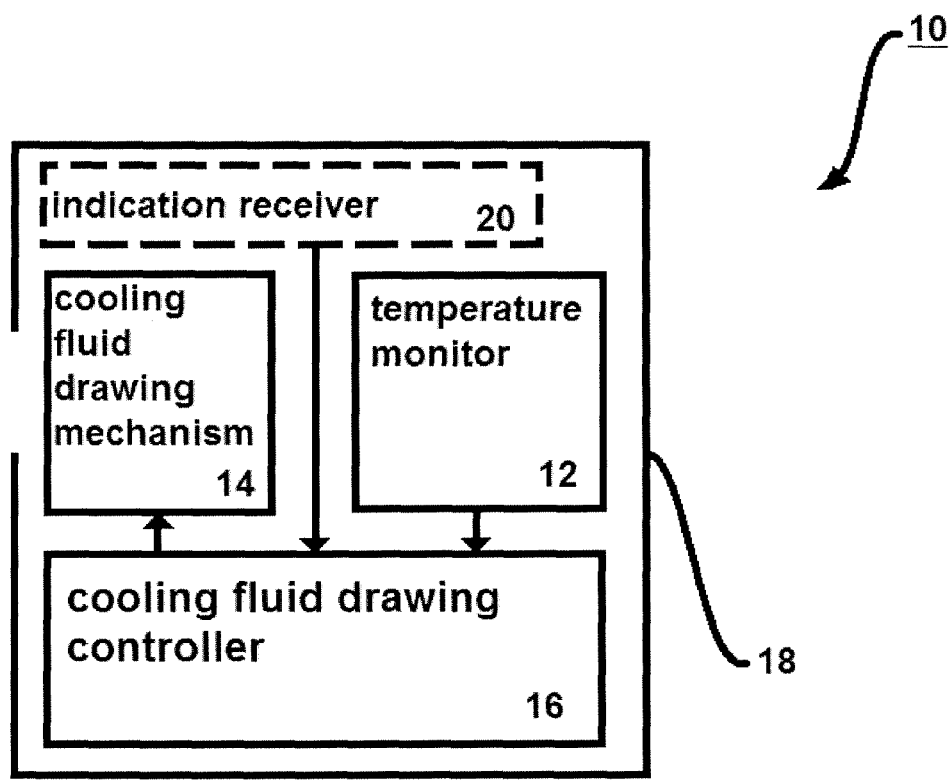
FIG. 4 is a schematic illustration of a computing device embodying the present invention.

FIG. 4 is a schematic illustration of a computing device 10 embodying the present invention. Certain typical components of a computing device 10 are omitted for illustration purposes, but computing devices 10 embodying the present invention may also comprise one or more of the following components: cpu, a storage unit, memory, I/O devices, motherboard, display unit. Furthermore, one or more of those components may provide hardware contributing to the functionality of the illustrated components. The illustrated components are a temperature monitor 12, a cooling fluid drawing mechanism 14, a cooling fluid drawing controller 16, and an indication receiver 20. The indication receiver 20 is illustrated in dashed lines to denote that it is optional in invention embodiments, although some means for generating and/or receiving indications is required, it may, for example, be a function of another component, such as the cooling fluid drawing controller 16. The components are housed within a housing 18.

The computing device 10 may be, for example, a server or a computer in a high performance computing environment. The computing device 10 is operable in a data centre environment or in some other environment in which a plurality of computing devices operate in an enclosed environment. The plurality of computing devices may be interconnected wirelessly, via a bus, or via some other means. The computing device may be a server which is installable in a rack or some other structure adapted to host more than one such server.

The housing 18 may also be termed a case, and is a hollow structure supporting and substantially surrounding the components which it houses. The housing 18 may form one or more openings which enable fluid communication between the interior of the housing and the environment surrounding the housing 18. For example, the housing 18 may form two openings, one of which is operable as an inlet, and the other of which is operable as an outlet, or exhaust. Of course, the openings may themselves comprise a formation composed of a plurality of smaller openings, such as a grid or mesh. Such a grid or mesh may be operable to allow fluid to pass, but to prevent debris from passing through the opening. The inlet and the outlet may be structurally similar and may be inter-changeable, with their roles being determined by the direction in which a cooling fluid drawing mechanism 14 is operable to draw cooling fluid. The illustrated housing 18 comprises an opening in the proximity of the cooling fluid drawing mechanism 14. Such an arrangement is typical and in some circumstances beneficial and efficient, though not essential.

The temperature monitor 12 is configured to monitor a temperature within the housing, and may be a function provided by software being run by the computing device 10. For example, the temperature monitor 12 may be a function of an operating system or motherboard. The temperature monitor 12 may be a combination of software and hardware, and may comprise a temperature sensor, along with some logic function operable to transmit readings or measurements to other hardware components (or to other functional components via hardware), for example, in response to requests or triggers. Similarly, the temperature monitor 12 may comprise a temperature sensor along with software which, when executed, takes readings from the temperature sensor, the reading having a value representative of the temperature at the temperature sensor. Such software is operable, when executed, to make a value representing the monitored temperature based on the reading from the temperature sensor available to other hardware or software components, such as the cooling fluid drawing controller 16. The temperature monitor 12 may include more than one temperature sensor at different positions within the housing, and software operable, when executed, to make readings from any one, or an aggregate or average or some other combination of readings from each available to other hardware or software components, or to make values representing the temperature based on such readings available.

The arrow linking the temperature monitor 12 and the cooling fluid drawing controller 16 represents the cooling fluid drawing controller 16 being operable to obtain a value representing the temperature being monitored by the temperature monitor 12 from the temperature monitor 12.

The cooling fluid drawing mechanism 14 is configured to draw cooling fluid into the housing 18. The cooling fluid drawing mechanism may be a valve configured to allow water to flow into piping removing heat as it passes hardware components in the housing 18 and flowing out via an outlet. Alternatively, the cooling fluid drawing mechanism 14 may be one or more fans configured to draw air into the housing 18 and to expel the air via an outlet. The air flows around hardware components in the housing 18 removing heat as it goes. Hence, the cooling fluid is cool on entry to the housing 18 relative to its temperature on exhaust from the housing 18. The cooling fluid drawing mechanism may be located next to one or more inlets. For example, if there are more than one components that tend to generate a lot of heat, then a separate fan and inlet may be provided for each of the more than one components.

The cooling fluid drawing mechanism 14 is under the control of the cooling fluid drawing controller 16. The cooling fluid drawing controller 16 is configured to set and adjust the operating state of the cooling fluid drawing mechanism and hence to control the rate at which the cooling fluid drawing mechanism 14 draws cooling fluid into the housing 18, and optionally also to switch the cooling fluid drawing mechanism on and off. Operating states may be, for example, speeds of one or more fans, or positions of one or more valves. An operating state may be set by signalling between the cooling fluid drawing controller 16 and the cooling fluid drawing mechanism 14.

The cooling fluid drawing controller 16 is configured, when the computing device 10 is installed within an enclosure as one of a plurality of computing devices, to obtain a value representing the monitored temperature from the temperature monitor 12, and if the value is within a predetermined range of values, to select an operating state for the cooling fluid drawing mechanism 14 from among a first operating state in which the cooling fluid drawing mechanism 14 is operable to draw cooling fluid into the housing at a first rate, and a second operating state in which the cooling fluid drawing mechanism 14 is operable to draw cooling fluid into the housing at a second rate lower than the first rate, and to run the cooling fluid drawing mechanism 14 in the selected operating state.

It may be, for example, that the procedure of obtaining a value representing the monitored temperature from the temperature monitor 12 is performed periodically by the cooling fluid drawing controller 16. Alternatively, it may be that the temperature monitor 12 is configured to transmit a value representing the monitored temperature when the monitored temperature reaches a particular value, or crosses a particular threshold. Examples of such thresholds include the lower and upper limits of the predetermined range of values. The transmission of a value representing a monitored temperature from the temperature monitor 12 to the cooling fluid drawing controller 16 is exemplary of the cooling fluid drawing controller 16 obtaining a value representing the monitored temperature from the temperature monitor 12.

The cooling fluid drawing controller 16 may also be configured to select operating states for the cooling fluid drawing mechanism 14 when the monitored temperature is outside of the predetermined range. It may be that when a temperature value is obtained which is below a lower limit of the acceptable range, the cooling fluid drawing controller is configured to select an operating state for the cooling fluid drawing mechanism 14 in which cooling fluid is drawn into the housing 18 at a low rate. For example, the low rate may be zero, or may be equal to or below the rate at which the cooling fluid drawing mechanism 14 draws cooling fluid into the housing 18 in the second operating state. Conversely, it may be that when a temperature value is obtained which is above an upper limit of the acceptable range, the cooling fluid drawing controller 16 is configured to select an operating state for the cooling fluid drawing mechanism 14 in which cooling fluid is drawn into the housing 18 at a high rate. For example, the high rate may be a maximum achievable with the cooling fluid drawing mechanism 14, or may be equal to or above the rate at which the cooling fluid drawing mechanism 14 draws cooling fluid into the housing 18 in the first operating state. The predetermined range may have only an upper limit, only a lower limit, or may have both an upper and a lower limit. For example, the predetermined range may have its lower limit at or around a temperature below which the computing device 10 is able to operate in the absence of cooling fluid. The upper limit of the predetermined range may be set at or around a temperature above which hardware components may be damaged if the temperature is not reduced, or which is dangerous for some other reason.

The cooling fluid drawing controller 16 is configured to set operating states of the cooling fluid drawing mechanism 14, that is, to select operating states for the cooling fluid drawing mechanism 14 and run the cooling fluid drawing mechanism 14 in the selected state. The cooling fluid drawing controller 16 also has control over the time period for which the cooling fluid drawing mechanism 14 is run in a particular operating state. It may be that when the cooling fluid drawing controller 16 sets a particular operating state for the cooling fluid drawing mechanism 14, it also sets a timer, after which timer has expired, the operating state is either switched regardless of temperature, or another temperature value is obtained and the process of comparing the obtained value with the predetermined range, and selecting operating states and running operating states is repeated. The time may be a fixed period of time which is common to all cooling fluid drawing controllers 16 in an enclosure. Alternatively, in order to avoid disruption to airflow patterns caused by synchronous alteration of operating states of cooling fluid drawing mechanisms 14 in multiple machines in the enclosure, it may be that the cooling fluid drawing controller is configured to include a random component in the time period.

The cooling fluid drawing controller 16 is configured to adjust certain variables, for example fan speeds, valve positions, or power delivered to fans. The cooling fluid drawing controller 16 may not have absolute control over the rate at which cooling fluid is drawn into the housing 18, because said rate may be dependent on environmental variables external to the computing device 10. However, the cooling fluid drawing controller 16 has control over relative rates at which cooling fluid is drawn into the housing 18, so it is aware that setting the fan or fans at higher speeds will draw more cooling fluid into the housing than would be drawn by setting the fan or fans at relatively lower speeds.

The cooling fluid drawing controller 16 is operable to obtain or receive an indication of demand for cooling fluid from a group of one or more other computing devices from among the plurality of computing devices. It may be that the cooling fluid drawing controller 16 includes an indication receiver, which may be a software function configured to receive an indication signal from a sensor or some other hardware external to the computing device 10. Alternatively, it may be that the indication receiver 20 is provided as a piece of hardware distinct from the cooling fluid drawing controller 16 and configured to receive an indication signal from a sensor or some other hardware external to the computing device 10, and to relay the signal to the cooling fluid drawing controller 16. Optionally, the processor of the computing device 10, when executing software embodying the cooling fluid drawing controller 16, is configured to pull the indication from a sensor or indication receiver 20. Alternatively, the software could be embedded elsewhere.

The cooling fluid drawing controller 16 is configured to use the received indication to select between potential operating states for the cooling fluid drawing mechanism 14. Specifically, the cooling fluid drawing controller 16 is configured to use the indication to select an operating state for the cooling fluid drawing mechanism 14 from among a first operating state in which the cooling fluid drawing mechanism 14 is operable to draw cooling fluid into the housing at a first rate, and a second operating state in which the cooling fluid drawing mechanism 14 is operable to draw cooling fluid into the housing at a second rate lower than the first rate, and to run the cooling fluid drawing mechanism 14 in the selected operating state. In other words, the cooling fluid drawing controller 16 is operable to use the indication to determine whether to choose an operating state which places a low or high demand on the supply of cooling fluid from which the cooling fluid is drawn into the housing 18 by the cooling fluid drawing mechanism 14. When the indication 20 is that demand for cooling fluid from a group of one or more other computing devices from among the plurality of computing devices is low, then the cooling fluid drawing controller 16 is configured to select the first operating state. Therefore, when the indication is that demand on cooling fluid is not high in the group (which may also be referred to as 'the neighbourhood' if the group are proximal to the computing device 10 relative to other computing devices in the plurality), the cooling fluid drawing controller 16 selects the operating state with a higher rate of cooling fluid draw into the housing 18. Conversely, when the indication is that demand for cooling fluid from a group of one or more other computing devices from among the plurality of computing devices is high, the cooling fluid drawing controller 16 is configured to act unselfishly by selecting the operating state with a lower rate of cooling fluid draw into the housing.

The indication receiver 20 is linked to a sensor or to some other source of information about demand for cooling fluid from the group of computing devices. Specifically, the group of computing devices upon which the indication is based may be those that are located in physical proximity to the computing device 10 relative to other computing devices in the plurality. For example, it may be those housed on the same rack, or those within a maximum physical distance from the computing device 10. Alternatively, it may be that the nature of the sensor upon which the indication is based is such that the level of influence exerted on the indication by a computing device (or, more specifically, by an indicator of the rate at which the computing device is drawing cooling fluid) is inversely proportional to its distance from either the sensor or from the computing device 10. The sensor may be a noise sensor, configured to sense noise from fans in other computing devices (and the computing device itself) and to generate an indication based on the amount of noise sensed. Wherein a noise level above a threshold is an indication of high fan speeds and hence high demand for cooling fluid (and an indication of high flow rates) and a noise level below the threshold is an indication of low demand. Alternatively, the sensor may be a temperature sensor located such that it can sense the temperature of the exhaust air from one or more computing devices. In such embodiments exhaust temperature above a threshold is an indication of high cooling fluid demand (or high cooling fluid draw, draw being flow into the housing of a computing device) and exhaust temperature below the threshold is an indication of low cooling fluid demand. Another example is the indication receiver 20 being configured to receive information from the power supply units of the group of other computing devices. The indication receiver may be configured to aggregate the information and to generate a value representing the combined power draw of the group of computing devices (which may be a weighted average with weightings inversely proportional to distance from the computing device 10 in question) for comparison with a threshold, with a combined power draw over the threshold being an indication that demand for cooling fluid is high amongst the group. Conversely, a power draw below the threshold may be an indication that demand for cooling fluid is low amongst the group.

Figure 5:
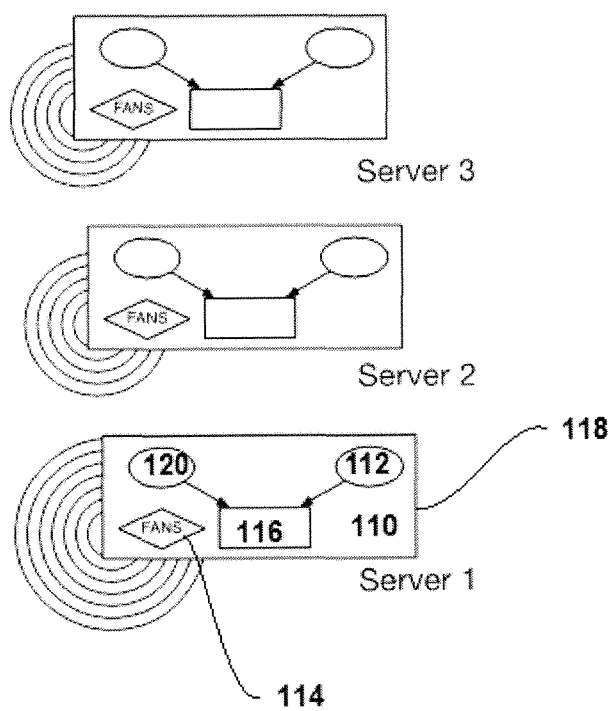
FIG. 5 illustrates a server neighbourhood embodying the present invention.

FIG. 5 illustrates a plurality of servers 110. The servers 110 are three among a plurality of more than three servers. The servers 110 are exemplary of computing devices mentioned elsewhere in this document. The servers 110 are installed close to each other within an enclosure and receiving cooling from a shared resource. They each have a control system 116 to manage their internal temperature, which is exemplary of a cooling fluid drawing controller. The control system 116 receives information from two sources, based on which information the control system is configured to select an operating state for the fans 114 of the respective server 110. The fans 114 are exemplary of the cooling fluid drawing mechanism 14 mentioned elsewhere in this document. The first information source is a sensor 112 which senses the state of the environment inside the housing 118 of the server 110. The sensor 112 is a temperature sensor, and is exemplary of a temperature monitor. The second information source is a neighbourhood monitor 120. The neighbourhood monitor 120 monitors the state of the neighbourhood of the server 110. In the example of FIG. 5, servers 1 and 2 are the neighbourhood monitored by the neighbourhood monitor of server 3; servers 2 and 3 are the neighbourhood monitored by the neighbourhood monitor of server 1; and servers 1 and 3 are the neighbourhood monitored by the neighbourhood monitor of server 2. The neighbourhood monitor 120 is exemplary of an indication receiver 20.

The sensor 112 is configured to report to the control system 116 when the temperature reaches a level at which cooling is desirable (the bottom of the predetermined range of values). The control system 116 only increases cooling by running the fans 114 in an operating state in which they draw an increased level of cooling fluid into the housing 118 if the neighbourhood monitor 120 indicates that doing so will not harm the delivery of cooling fluid to the neighbourhood, that is, if the neighbourhood monitor 120 indicates that demand for cooling in the neighbourhood is low. In the example of FIG. 5, the neighbourhood monitoring is of the sound produced by the fans of servers in the neighbourhood (a correction may be applied to cancel the effect of fan noise from the server 110 itself). The number of rings at each server represents the sound level or fan speed of the server. An increase in the fan noise (e.g. Server 1) indicates it requires enhanced cooling, and that demand for cooling fluid in the neighbourhood is high. If Server 2 then requires increased cooling it would infer from increased noise levels that doing so would deprive Server 1 of the cooling it requires and would defer this demand. In this way the group of servers optimises the distribution of a shared resource without the use of a central control mechanism.

Figure 6:
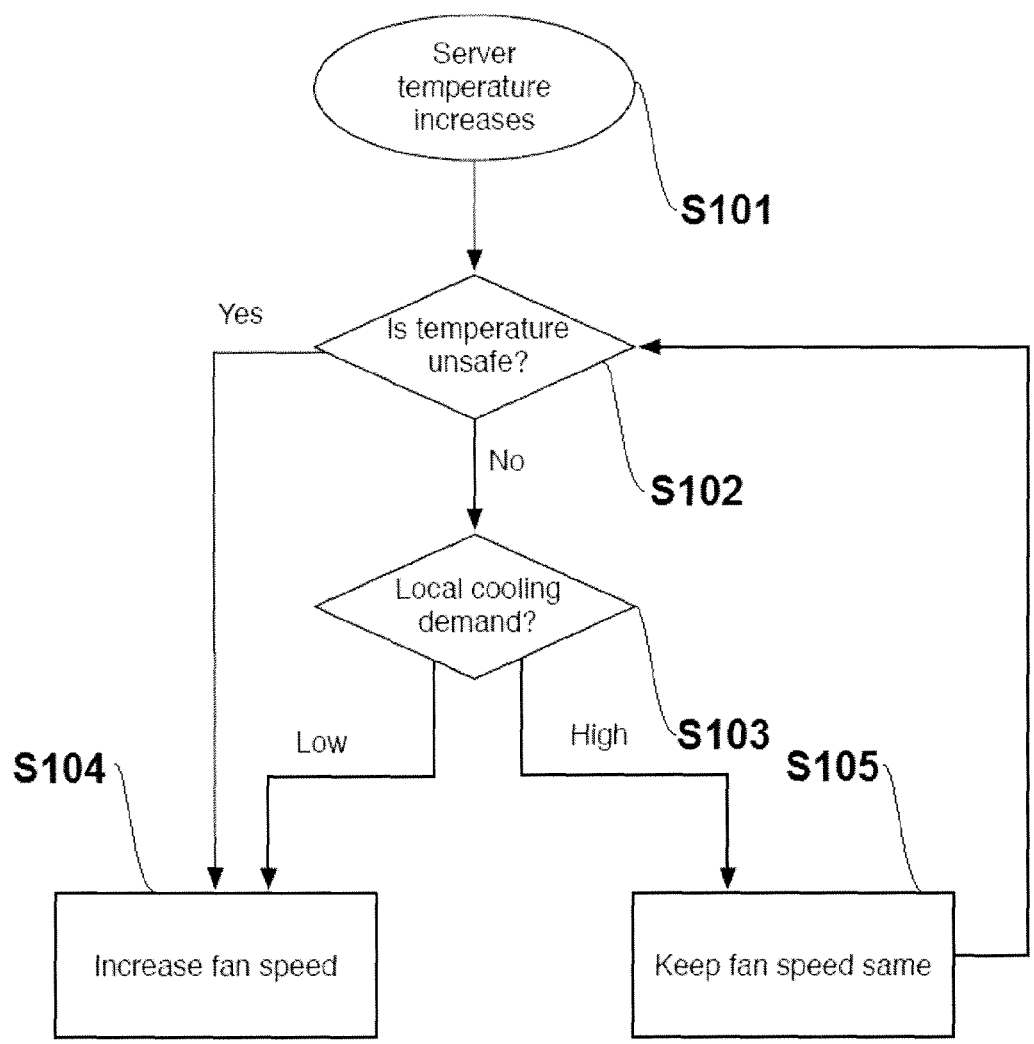
FIG. 6 illustrates a process embodying the present invention.

FIG. 6 illustrates a process carried out by a computing device. Prior to the start of the process, the internal temperature of the computing device is below the lower limit of a predetermined range, and the fans are running at a lower speed setting of two possible operating states. At S101 a temperature monitor 12 reports to a cooling fluid drawing controller 16 that the monitored temperature has risen from below the lower limit of a predetermined range of values to above the lower limit of a predetermined range of values.

At step S102 the monitored temperature is compared with the upper limit of the predetermined range of values. The upper limit of the predetermined range of values defines a threshold above which it is deemed that the temperature in the housing 18 is unsafe and risks damage to components inside the housing, or in extreme cases, a fire risk. If, at step S102, it is determined that the monitored temperature exceeds the upper limit of the predetermined range of temperatures, then the flow proceeds to S104 and the fans, which are exemplary of a cooling fluid drawing mechanism, are increased to a higher speed setting of the two possible operating states.

If, at step S102, it is determined that the monitored temperature does not exceed the upper limit of the predetermined range of temperatures, and hence is within the predetermined range of temperatures, then the flow proceeds to S103. At step S103 an indication of local cooling demand is obtained, for example, by an indication receiver 20. The indication is a signal indicating high or low, or may be a value which is compared with a threshold by the cooling fluid drawing controller 16 to determine whether it indicates high or low. Local denotes a group of other computing devices in proximity to the computing device 10 executing the process.

If at S103 the obtained indication is that cooling demand (demand for cooling fluid) among the local computing devices is low, then the flow proceeds to S104 and the operating state of the fans is changed to the higher speed setting. If, on the other hand, the obtained indication is that cooling demand among the local computing devices is high, then the flow proceeds to step S105 and the fan speed is maintained at the lower speed setting, and the flow returns to step S102.

Figure 7:
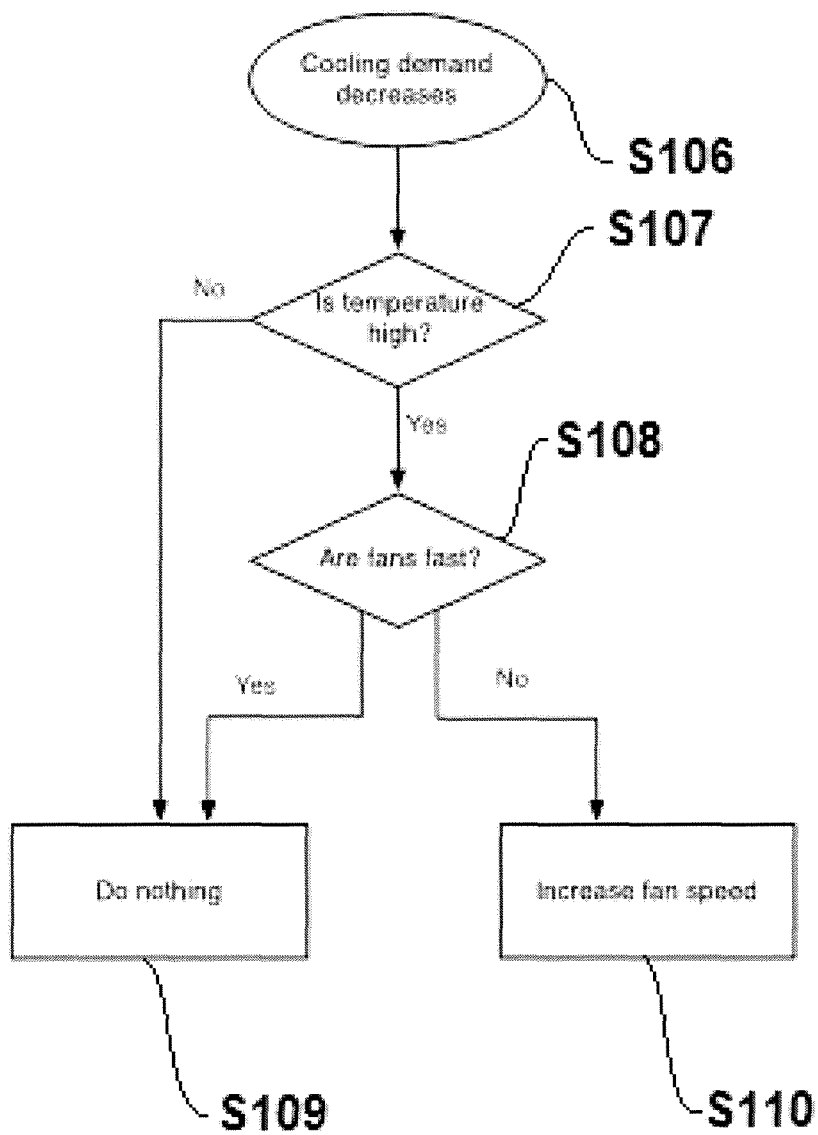
FIG. 7 illustrates a continuation of the process of FIG. 6.

FIG. 7 illustrates a continuation of the process in FIG. 6. At the onset of the process of FIG. 7, it is assumed that the temperature in the housing has not exceeded the upper limit of the predetermined range. The cooling fluid drawing controller 16 could be running the cooling fluid drawing mechanism in either the lower or the higher of two operating states (that is, running fans at a lower or higher of two speeds). If, at any time, the temperature in the housing exceeds the upper limit of the predetermined temperature range, the cooling fluid drawing mechanism is immediately set to run in the higher of the two operating states, or in an operating state in which cooling fluid is drawn into the housing of the computing device at least at the same rate as in the higher of the two operating states.

The demand for cooling fluid among the group of computing devices is monitored on a continual or intermittent basis by the cooling fluid drawing controller 16. At step S106 the demand for cooling decreases from high to low. At step S107 the monitored temperature from the temperature monitor 12 is compared with the lower limit of the predetermined range of values. If the temperature is below the lower limit ('no' at step S107) then the flow moves to S109 and the fans 14 remain in their existing operating state. That is to say, if the fans were previously running at high speed due to the temperature having exceeded the upper limit of the predetermined range, they are able to continue at that speed. If, on the other hand, the fans were running at the lower speed, there is no particular need to increase their speed as the temperature is not unsafe, so the fans continue at the lower speed.

If at S107 it is determined that the monitored temperature does exceed the lower limit of the predetermined range, and hence is within the predetermined range, then the flow proceeds to S108. At S108 the fan speed is checked. Either the fans are being run at the higher or the lower speed. The fans being run at the higher speed would indicate that the temperature had previously exceeded the upper limit of the predetermined range and was in the process of being brought down by running the fans at the higher speed. If the fans are being run at the lower speed, it is an indication that either at the previous check the monitored temperature was below the lower limit of the predetermined range and hence the lower speed provided sufficient cooling, or that the monitored temperature was above the lower limit and below the upper limit, and hence the cooling fluid drawing controller acted unselfishly in selecting the lower of the two speeds due to high local demand for cooling fluid. However, now that an indication is received that local demand for cooling fluid is low, there is no need to behave unselfishly, hence, in steps S108 to S110, the fan speed is either increased to or maintained at the higher speed.

Embodiments have the capability to monitor demand for cooling fluid among a group of other computing devices. The monitoring capability may comprise simply intermittently receiving an indication, the indication being generated by an external monitoring device. Such an external monitoring device senses the state of the neighbouring equipment (IT equipment such as storage units or servers may be installed in data centre enclosures in cabinets—known as racks—that contain many pieces of equipment, these racks are arranged in rows in a data centre enclosure). The rows are arranged so that a large number of racks—hence servers—share a supply of cooling. One or more of the servers in the data centre enclosure are exemplary of the server 10 of FIG. 4 and are configured to monitor cooling fluid demand among neighbouring servers and to adjust their own demand for cooling fluid accordingly. Neighbouring in this sense may be those servers that have the largest impact on the amount of cooling that a server receives, the servers above and below in the same rack and, to a lesser extent, those in neighbouring racks.

There are many ways that the demand for cooling fluid among the group of other computing devices, which can be referred to as 'the neighbourhood', can be determined and some of these are described below. The monitoring of the demand for cooling fluid among the neighbourhood does not have to be precise; an indication which enables a cooling fluid drawing controller 16 to distinguish between a busy neighbourhood which requires lots of cooling (and any increase in cooling demand by the computing device itself will strain the delivery of cooling resource) and a quiet neighbourhood which does not (the cooling demanded by the servers in the neighbourhood can be easily delivered by the central resources and increasing demand by the computing device itself will not affect this).

Computing devices embodying the present invention are connectable to a monitoring device configured to monitor the demand for cooling among a group of computing devices among a plurality of computing devices in a data centre enclosure. By connection to such a monitoring device, the cooling fluid drawing controller is thus able to obtain or generate an indication of demand for cooling among the group of computing devices, and to modify the operating state of the cooling fluid drawing mechanism accordingly. The cooling fluid drawing controller in combination with the monitoring device provides an ability to sense the cooling requirements of a server's neighbourhood: the monitoring device indicates 'quiet' or 'low' when the neighbourhood is adequately cooled and 'busy' or 'high' when the group of devices are operating in a manner which represents an attempt to draw cooling fluid into their respective housings at a high rate.

Internal temperature sensing and monitoring by the temperature monitor 12 reports the temperature state within the housing (or the states of a number of sub-regions within the housing). The reported states may be, for example, cool when the server is adequately cooled, warm when the server would benefit from extra cooling but the temperatures are not critical for reliability i.e. cooling is not necessary, but could be applied beneficially, and hot when the server must be cooled immediately. Cool represents temperatures below the lower limit of the predetermined range. Warm represents temperatures within the predetermined range. Hot represents temperatures above the predetermined range. In the warm region, fan speed does not necessarily increase with internal temperature increase. Instead, the increase in fan speed is either delayed until either a delay period expires or the temperature moves into the hot region.

Embodiments utilize a first and a second operating state for the cooling fluid drawing mechanism, corresponding to a high and a low rate of drawing cooling fluid into the housing respectively, or a high and low fan speed respectively. High and low in this sense is relative. The two operating states are not necessarily the only two operating states in which the cooling fluid drawing mechanism is operable to be run, but are simply two operating states which are comparable such that a high and low from among the two operating states can be determined. The high and low states can also be referred to as standard mode and enhanced mode respectively. In standard mode, the cooling fluid drawing mechanism makes a low or minimum demand on the supply of cooling fluid. For example, in standard mode a fan may be set to a minimum speed or turned off. The enhanced mode makes more demands on the supply of cooling fluid, for example, by increasing fan speed. The increase from one state to another may be continuous or may be a discrete change. In computing devices with more than one fan it may be that the state of each can be controlled independently.

The operating states may each cover a range of fan speeds rather than a single fan speed, but do not overlap. For example, in embodiments with fans that have variable speeds, in standard mode there may be a maximum fan speed which is not exceeded when it is determined that demand for cooling fluid among the neighbourhood is high.

Figure 8:
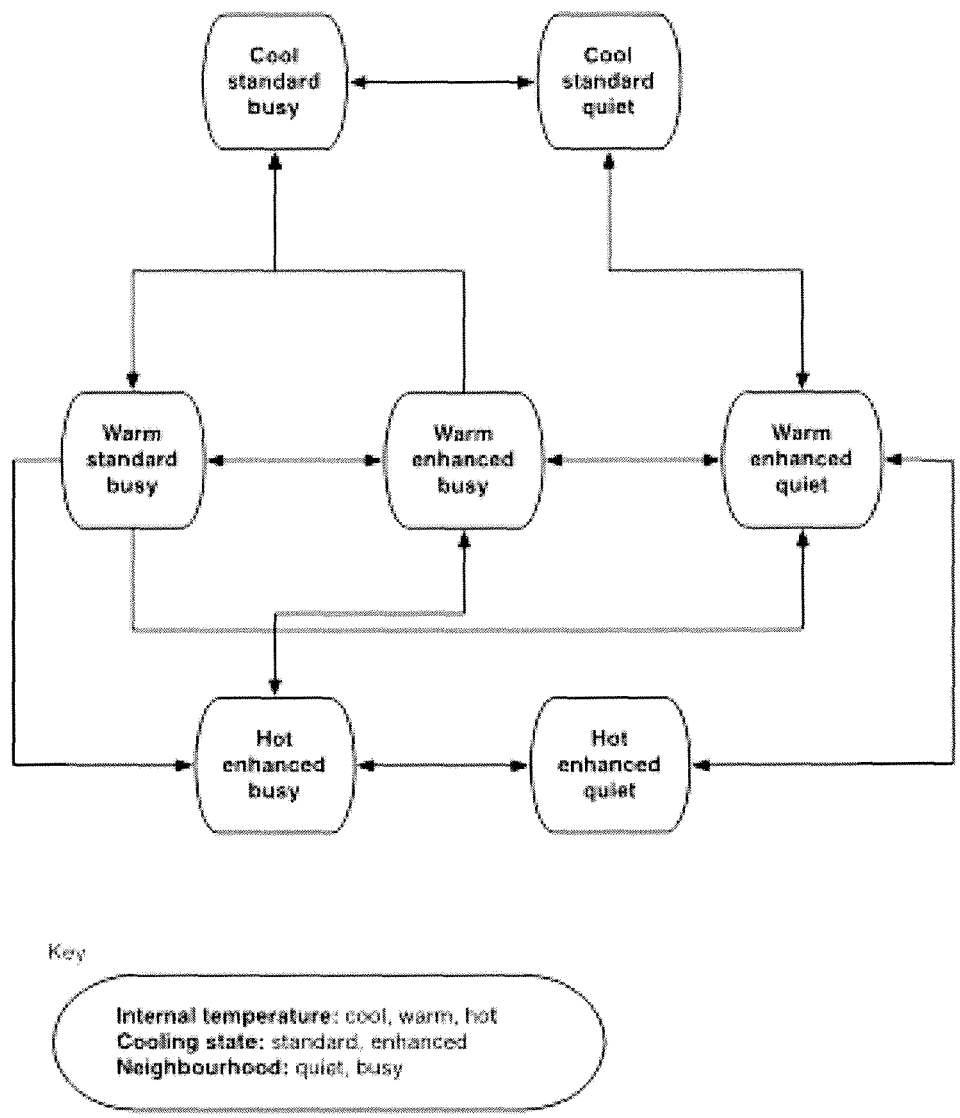
FIG. 8 illustrates states of systems embodying the present invention.

FIG. 8 illustrates the states of the system (the system being the monitored internal temperature of the housing, the operating state of the cooling fluid drawing mechanism, and the indication of demand for cooling in the group of computing devices). As detailed above, the monitored internal temperature can be cool (below the lower limit of the predetermined range of values), warm (within the predetermined range of values), or hot (above the upper limit of the predetermined range of values). The operating state of the cooling fluid drawing mechanism can be standard (second operating state/lower rate of drawing cooling fluid into the housing/lower fan speed) or enhanced (first operating state/ higher rate of drawing cooling fluid into the housing/higher fan speed). The indication of demand for cooling in the group of devices can be busy (high demand) or quiet (low demand).

In some embodiments, there may be additional operating states in which to run the cooling fluid drawing mechanism, beyond standard and enhanced. For example, there may be an additional higher state with an associated rate of cooling fluid draw higher than the first rate associated with the first (or enhanced) operating state. Such a state may be selected if the temperature in the housing is high, and the indication indicates that demand for cooling fluid in the neighbourhood is low. The computing device can then be very quickly returned to a safe operating temperature. Similarly, there may be an additional lower state with an associated rate of cooling fluid draw that is lower than the second rate associated with the second (or standard) operating state. The additional lower state may be selected if the indication indicates that the demand for cooling fluid in the neighbourhood is high, and the temperature in the housing is at the lower end of the safe operating range.

The arrowed lines in FIG. 8 illustrate the transitions between states. The table of FIG. 9 details the events which may cause the state transitions.

The embodiment exemplified in FIG. 9 includes timers in the control logic. When a server enters the "Warm, standard, busy" state, though it may benefit from cooling, it assumes that other servers in its neighbourhood are in more need and so does not increase its cooling demands by switching to enhanced mode. It could stay in this state until it gets too hot or the neighbourhood quietens, but its stay as "warm" may also be time limited to avoid extended periods of raised temperatures which can affect reliability and server lifetime. The timer has effect of waiting for a certain period and then moving to the "Warm, enhanced, busy" state regardless of the neighbourhood state.

When a server is in the "Warm, enhanced, busy" state it is making a high demand on the available cooling fluid, so the time in this state may also be limited (to eventually allow neighbours access to the cooling resources) by a timer.

The lengths of these two timers may have a random component to prevent synchronised waves of state changes flowing through the data centre, as well as other types of instabilities.

The following activities are exemplary of activities which may be performed upon entry to each state:

Cool, standard, busy. Run cooling fluid drawing mechanism in second (lower) operating state. Any active timers invalidated.

Cool, standard, quiet. Run cooling fluid drawing mechanism in second (lower) operating state.

Warm, standard, busy. Run cooling fluid drawing mechanism in second (lower) operating state. Activate a timer (for transition to enhanced).

Warm, enhanced, busy. Run cooling fluid drawing mechanism in first (higher) operating state. Activate a timer (for transition to standard)

Warm, enhanced, quiet. Run cooling fluid drawing mechanism in first (higher) operating state. Any active timers invalidated.

Hot, enhanced, busy. Run cooling fluid drawing mechanism in first (higher) operating state. Any active timers invalidated.

Hot, enhanced, quiet. Run cooling fluid drawing mechanism in first (higher) operating state.

The second operating state of the cooling fluid drawing mechanism, which places a lower demand on the supply of cooling fluid than the first operating state, can be achieved in a number of ways.

In embodiments in which one or all of the fans of a computing device are controlled to run at the same speed, then the second operating state simply corresponds to a lower fan speed than the first operating state.

In embodiments in which there are a number of fans and a number of temperature sensors within the housing and it is possible to control the fan speeds individually in response to a corresponding sensor indicating that a region of the server needs cooling, the difference between the first operating state and the second operating state could be that in the first operating state the speed of the fan(s) serving the region that requires cooling is set a higher level. Under busy neighbourhood conditions in which the cooling fluid drawing controller is not permitted to run the cooling fluid drawing mechanism in the first operating state, the controller may increase some and decrease other of the fan speeds to direct more cooling to the affected area and less to other areas of the housing with the aim of keeping the overall amount of cooling required by the server the same.

An additional control strategy when the fans are in the second operating state is to reduce the amount of heat generated by the affected component. The cooling fluid drawing controller may be linked to, say, the CPU, and configured to send a request to the CPU to reduce power consumption when the controller detects that the neighbourhood is busy and is reaching internal temperature limits so that it, may, need to increase cooling. CPUs can respond in a number of established ways depending on its quality of service contract with the operating system e.g. use DVFS or send a request to the OS to reduce the amount of work in that server.

Embodiments include a monitoring capability to generate an indication of demand for cooling fluid among a group of other computing devices. This monitoring does not have to be precise; a coarse value that reflects state of the neighbourhood (the group of other computing devices may be referred to as the neighbourhood) in aggregate is sufficient. Monitoring methods are sensitive to the fact that, because the IT environment is dynamic, occasionally a server will have a large load and so need "enhanced" cooling. The enhanced cooling demand is transient and servers may return to a default or standard demand for cooling fluid after a time. So an indication of a busy neighbourhood is a recent increase in demand for cooling fluid or, as described below, a recent change in the measured parameter value. Similarly, a decrease in the monitored quantity value indicates a change to a quiet neighbourhood. An alternative strategy is for the monitoring devices to determine a base value as a continuously updated average of recent values. The base value indicates a quiet neighbourhood with a low demand for cooling fluid.

Embodiments are operable in a mixed environment where some servers have capability to modify cooling fluid demand in response to demand for cooling fluid in other computing devices and others do not. The servers with the capability will respond to load changes to smooth out the demands, increasing efficiency regardless of the remaining servers.

Monitoring devices and techniques are not exhaustive or exclusive. Embodiments could combine two or more monitoring methods to obtain more reliable neighbourhood monitoring.

The noise that a server makes is almost entirely generated by the cooling fans. This noise increases as the rotation speed increase by the 5th power (rotation speed increases to increase cooling). The strength of noise also decreases with distance from the source, so the overall noise level by a server is a good indicator of the state of cooling fluid demand in a server's neighbourhood. Since the local server also contains noise making fans it may be that the monitoring device is configured to subtract this effect from the neighbourhood noise, this is easily achieved using standard noise cancelling technology from, for example, mobile phone handsets. An alternative strategy is to detect increase in fan rotation speeds through frequency analysis of the local noise (faster rotation implies higher frequencies).

Figure 10:
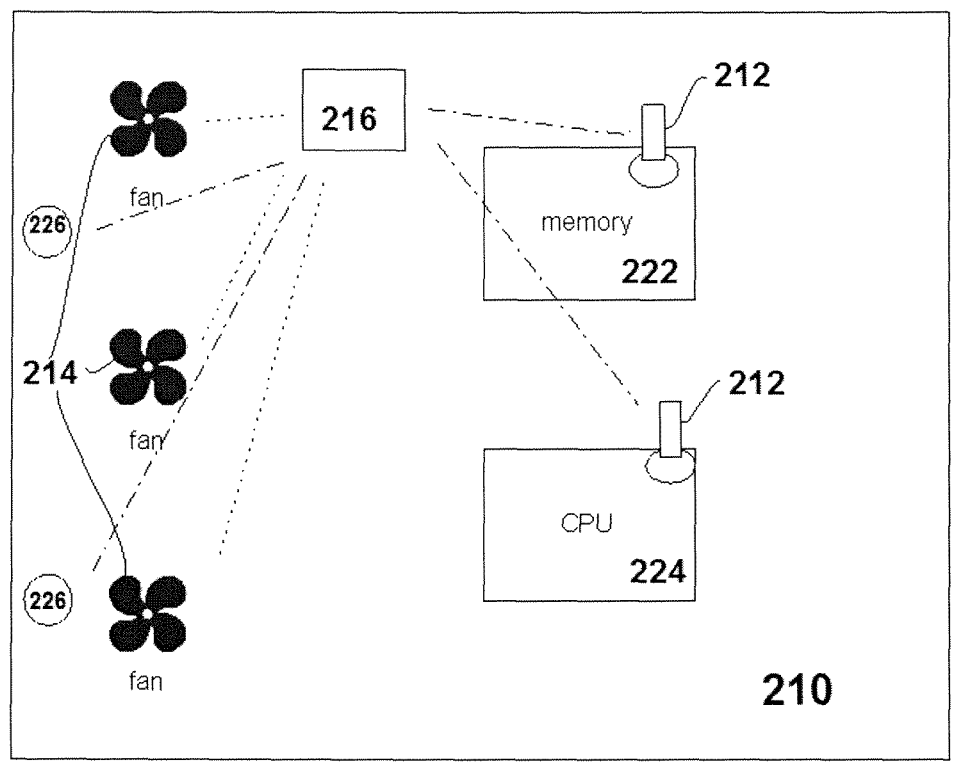
FIG. 10 illustrates a system embodying the present invention.

FIG. 10 illustrates a computing device 210 including, or connectable to, neighbourhood sensing microphones. The neighbourhood sensing microphones 226 are exemplary of a monitoring device, and are configured to send sensor data to the cooling controller 216. The cooling controller 216 is exemplary of a cooling fluid drawing controller. Temperature sensors 212 are provided in proximity to heat generating components the memory 222 and the CPU 224. The temperature sensors send sensor data to the cooling controller 216. The cooling controller 216 generates control signals for the fans 214. When either of the temperature sensors 212 reports to the cooling controller 216 that the temperature at the sensor has exceeded the upper limit of a predetermined range of temperature values, the cooling controller 216 determines that immediate cooling is required and increases the speeds of one or more of the fans to increase cooling fluid draw into the housing, and hence cool the components 222 and 224. When either of the temperature sensors reports a temperature which is within the predetermined range of temperature values, the cooling controller 216 obtains an indication of cooling demand in the neighbourhood from the neighbourhood sensing microphones 226. If the neighbourhood sensing microphones 226 indicate that cooling demand is high in the neighbourhood, the fans 214 are run in an operating state which places a relatively low demand on the supply of cooling fluid. If the neighbourhood sensing microphones 226 indicate that cooling demand is low in the neighbourhood, the fans 214 are run in an operating state which places a higher demand on the supply of cooling fluid.

Figure 11:
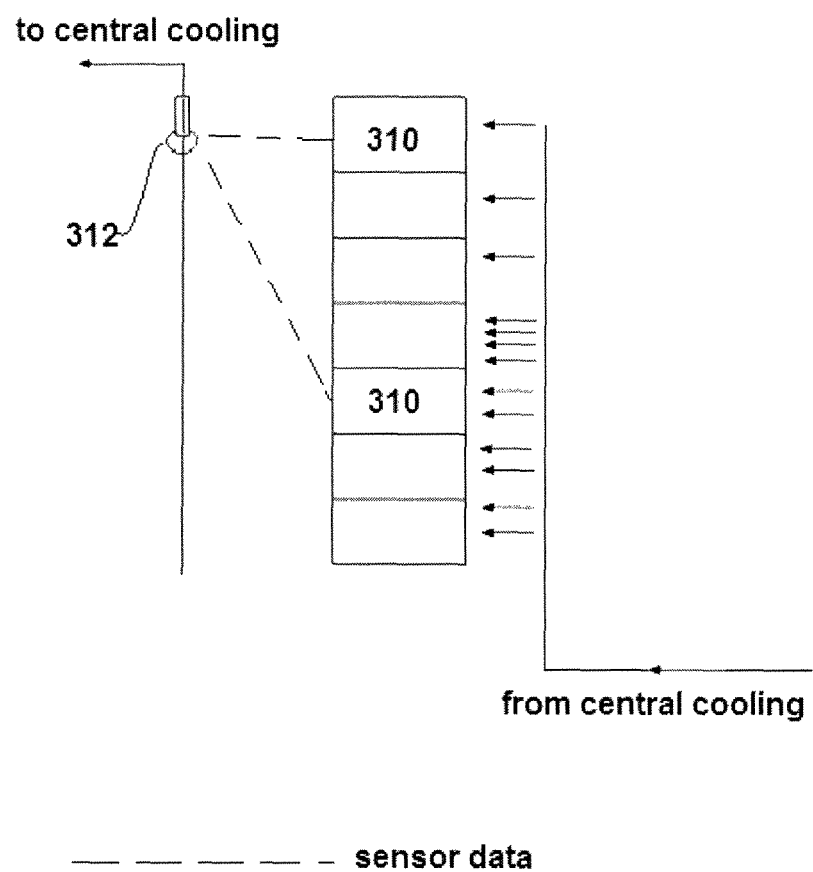
FIG. 11 illustrates an alternative system embodying the present invention.

FIG. 11 illustrates an embodiment in which the monitoring device is a temperature sensor 312 placed in the path of the exhaust air from a group of servers. Two servers 310 from among the servers are configured to receive temperature information from the temperature sensor 312 and to use the temperature information to generate an indication of demand for cooling fluid in the group of servers (higher exhaust temperatures indicate higher demand for cooling fluid).

In another embodiment, a group of servers receive power from a common distribution unit. An increase in the amount of power drawn indicated that at least one of the servers is working harder and hence demanding more cooling. One or more servers among the group can compare its power draw to the total power draw from the common distribution unit to infer an indication of demand for cooling fluid among the group. For example, if the total power increases by more than the power draw of an individual server, it may be taken as an indication that demand for cooling fluid in the neighbourhood is high.

In the above embodiments, the indication of high or low cooling demand in the group of servers may be generated either by comparison of a monitored property with a threshold value, or by responding to increases (demand high) or decreases (demand low) in the monitored property.

Although the aspects (software/methods/apparatuses) are discussed separately, it should be understood that features and consequences thereof discussed in relation to one aspect are equally applicable to the other aspects. Therefore, where a method feature is discussed, it is taken for granted that the apparatus embodiments include a unit or apparatus configured to perform that feature or provide appropriate functionality, and that programs are configured to cause a computing apparatus on which they are being executed to perform said method feature.

In any of the above aspects, the various features may be implemented in hardware, or as software modules running on one or more processors. Features of one aspect may be applied to any of the other aspects.

The invention also provides a computer program or a computer program product for carrying out any of the methods described herein, and a computer readable medium (such as a non-transitory storage medium) having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

The invention claimed is:

1. A computing device comprising:
a housing;
a temperature monitor configured to monitor a temperature within the housing;
a cooling fluid drawing mechanism configured to draw cooling fluid into the housing, the cooling fluid drawing mechanism being one or more fan;
a cooling fluid drawing controller being a processor and a memory of the computing device and being configured, when the computing device is installed within an enclosure as one of a plurality of computing devices, wherein the plurality of computing devices are installed within the enclosure, to obtain a value representing the monitored temperature, and;
when the value is within a predetermined range of values, to selects an operating state for the cooling fluid drawing mechanism from among a first operating state in which the cooling fluid drawing mechanism is operable to draw cooling fluid into the housing at a first rate, and a second operating state in which the cooling fluid drawing mechanism is operable to draw cooling fluid into the housing at a second rate lower than the first rate and to run the cooling fluid drawing mechanism in the selected operating state,
when the value is above the predetermined ranged of values, to select an operating state for the cooling fluid drawing mechanism in which the cooling fluid drawing mechanism is configured to draw cooling fluid into the housing at a rate equal to or above the first rate,
wherein the cooling fluid controller selects the first operating state when an exhaust temperature in a path of exhaust air from the plurality of computing devices is below an exhaust temperature threshold and the cooling fluid drawing controller selects the second operating state when the exhaust temperature is above the exhaust temperature threshold.

2. The computing device according to claim 1, wherein the cooling fluid drawing mechanism is a plurality of fans spaced apart from one another.

3. The computing device according to claim 2, wherein while running the cooling fluid drawing mechanism in the second operating state, the cooling fluid drawing controller is configured to increase a speed of one or more of the plurality of fans and to decrease a speed of one or more other of the plurality of fans, without altering an aggregate speed of the plurality of fans.

4. The computing device according to claim 1, wherein when the cooling fluid draw controller selects the second operating state, the cooling fluid drawing controller is configured to determine a length of time for which to run the cooling fluid drawing mechanism in the second operating state, and, following expiry of the determined length of time, to obtain the value representing the monitored temperature within the housing, and, when the value is within the predetermined range of values, to run the cooling fluid drawing mechanism in the first operating state.

5. The computing device according to claim 1, wherein when the cooling fluid drawing controller is running the cooling fluid drawing mechanism in the second operating state, the cooling fluid drawing controller is configured to monitor the exhaust temperature, and to change the operating state of the cooling fluid drawing mechanism from the second operating state to the first operating state in response to the exhaust temperature changing from being above the exhaust temperature threshold to being below the exhaust temperature threshold.

6. The computing device according to claim 1, wherein, the cooling fluid drawing controller is configured to periodically obtain the value representing the monitored temperature within the housing, and when the obtained value is below the predetermined range of values, the cooling fluid drawing controller is configured to run the cooling fluid drawing mechanism in an operating state in which the cooling fluid drawing mechanism is operable to draw cooling fluid into the housing at a rate less than the second rate.

7. A method of controlling a cooling fluid drawing mechanism configured to draw cooling fluid into a housing of a computing device installed within an enclosure as one of a plurality of computing devices, wherein the plurality of computing devices are installed within the enclosure, the cooling fluid drawing mechanism being one or more fans, the method comprising:
obtaining a value representing a temperature within the housing from a temperature monitor, and when the value is within a predetermined range of values, selecting an operating state for the cooling fluid drawing mechanism from among a first operating state in which the cooling fluid drawing mechanism is operable to draw cooling fluid into the housing at a first rate, and a second operating state in which the cooling fluid drawing mechanism is operable to draw cooling fluid into the housing at a second rate lower than the first rate, and when the value is above the predetermined range of values, selecting an operating state for the cooling fluid drawing mechanism in which the cooling fluid drawing mechanism is configured to draw cooling fluid into the housing at a rate equal to or above the first rate, and running the cooling fluid drawing mechanism in the selected operating state;

wherein the first operating state is selected when an exhaust temperature in a path of exhaust air from the plurality of computing devices is below an exhaust temperature threshold and the second operating state is selected when the exhaust temperature is above the exhaust temperature threshold.

8. A non-transitory storage medium storing a computer program which, when executed by a computing device having a processor and a cooling fluid drawing mechanism configured to draw cooling fluid into a housing of the computing device installed within an enclosure as one of a plurality of computing devices, wherein the plurality of computing devices are installed within the enclosure, causes the computing device to perform a method comprising:

obtaining a value representing a temperature within the housing from a temperature monitor, and when the value is within a predetermined range of values, selecting an operating state for the cooling fluid drawing mechanism from among a first operating state in which the cooling fluid drawing mechanism is operable to draw cooling fluid into the housing at a first rate, and a second operating state in which the cooling fluid drawing mechanism is operable to draw cooling fluid into the housing at a second rate lower than the first rate, when the value is above the predetermined range of values, selecting an operating state for the cooling fluid drawing mechanism in which the cooling fluid drawing mechanism is configured to draw cooling fluid into the housing at a rate equal to or above the first rate, and running the cooling fluid drawing mechanism in the selected operating state;

wherein the first operating state is selected when an exhaust temperature in a path of exhaust air from the plurality of computing devices is below an exhaust temperature threshold and the second operating state is selected when the exhaust temperature is above the exhaust temperature threshold.

* * * * *